United States Patent [19]

Longworth

[11] 4,345,211

[45] Aug. 17, 1982

[54] DIGITAL PHASELOCK DEMODULATOR

[75] Inventor: Joe D. Longworth, Cedar Rapids, Iowa

[73] Assignee: Rockwell International Corporation, El Segundo, Calif.

[21] Appl. No.: 187,117

[22] Filed: Sep. 15, 1980

[51] Int. Cl.³ .............................................. H03K 9/06
[52] U.S. Cl. ..................................... 329/50; 328/155; 329/107; 329/122; 375/94
[58] Field of Search ................................ 329/104–107, 329/50, 110, 122, 126, 128; 375/80–82, 94; 328/155; 331/1 A, 23

[56] References Cited

U.S. PATENT DOCUMENTS 3,781,695 12/1973 Jackson ............................... 328/155
3,883,817 5/1975 Cliff ..................................... 331/1 A
4,019,153 3/1977 Cox, Jr. et al. .................. 329/104 X

OTHER PUBLICATIONS

Blasche, "Analysis of a First Order Phase Locked Loop in the Presence of Gaussian Noise", Technical Memorandum NASA 46, Mar. 1977.
Chamberlin, "Digital Correlation Detector for Low-Cost OMEGA Navigation", NASA Technical Memorandum No. 19, Feb. 1976.
Pasternack et al., "Analysis and Synthesis of a Digital Phase-Locked Loop for FM Demodulation", The Bell System Technical Journal, Dec. 1968, pp. 2207–2237.

Primary Examiner—Siegfried H. Grimm
Attorney, Agent, or Firm—Terry M. Blackwood; H. Fredrick Hamann

[57] ABSTRACT

A digital phaselock demodulator suitable for demodulating a variety of phase or frequency modulated signals including an FM'd VOR signal component. A digital phase detector receives the modulated input signal and a feedback signal, and outputs demodulated signal. Two sets of digital words of different word rates are provided wherein one set is reversible in order as a function of phase between input and feedback signals. Digital word comparison occasions the feedback signal.

16 Claims, 5 Drawing Figures

DIGITAL PHASELOCK DEMODULATOR

This invention relates to digital phaselock loops and in the preferred application to FM demodulation.

Various forms of digital phaselock loops are known in the art. For example, see (1) the article by G. Pasternack and R. L. Whalin entitled, "Analysis and Synthesis of a Digital Phaselocked Loop for FM Demodulation", The Bell System Technical Journal, December 1968, Pages 2207 et seq., (2) Technical Memorandum NASA 46 entitled, "Analysis of a First Order Phaselocked Loop in the Presence of Gaussian Noise", by Paul R. Blasche, March 1977 and (3) Kent A. Chamberlin's article, "Digital Correlation Detector for Low-Cost Omega Navigation" NASA Technical Memorandum No. 19, February 1976.

However, prior art digital phaselock embodiments are often marginal or unsuitable for certain applications as FM demodulators. For example, the tracking capability of prior art embodiments can prove unsatisfactorily slow for demodulating signals such as the VOR signal component which comprises a 9960 Hz subcarrier deviated ±480 Hz according to a 30 Hz sinusoid.

In accordance with the present invention, there is featured the provision of a digital phaselock loop which has improved versatility as an FM demodulator and more specifically which is suitable for FM demodulation applications such as demodulating the aforesaid VOR signal. These and other features, aspects, and advantages will become more apparent upon reference to the following specification, claims, and appended drawings in which:

Figure 1:
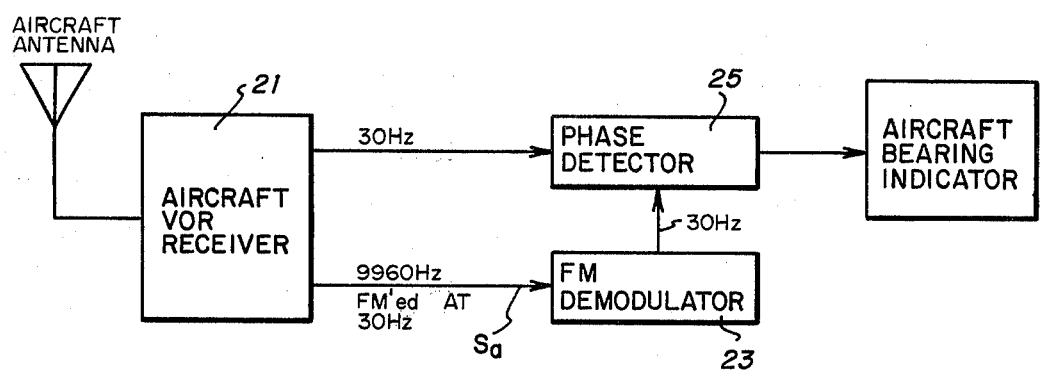
FIG. 1 is a schematic representing the presently preferred application, namely, a VOR receiving system.

Referring now to FIG. 1, which shows the presently preferred application, an aircraft's VOR receiver 21 supplies a first 30 Hz signal and a 9960 Hz signal which is FM'd according to a second 30 Hz signal. The 9960 Hz component is fed through FM demodulator 23 so as to recover the 30 Hz FM thereon. Then the two different 30 Hz signals are phase compared in detector 25 to provide a bearing indication for the aircraft.

Figure 2:
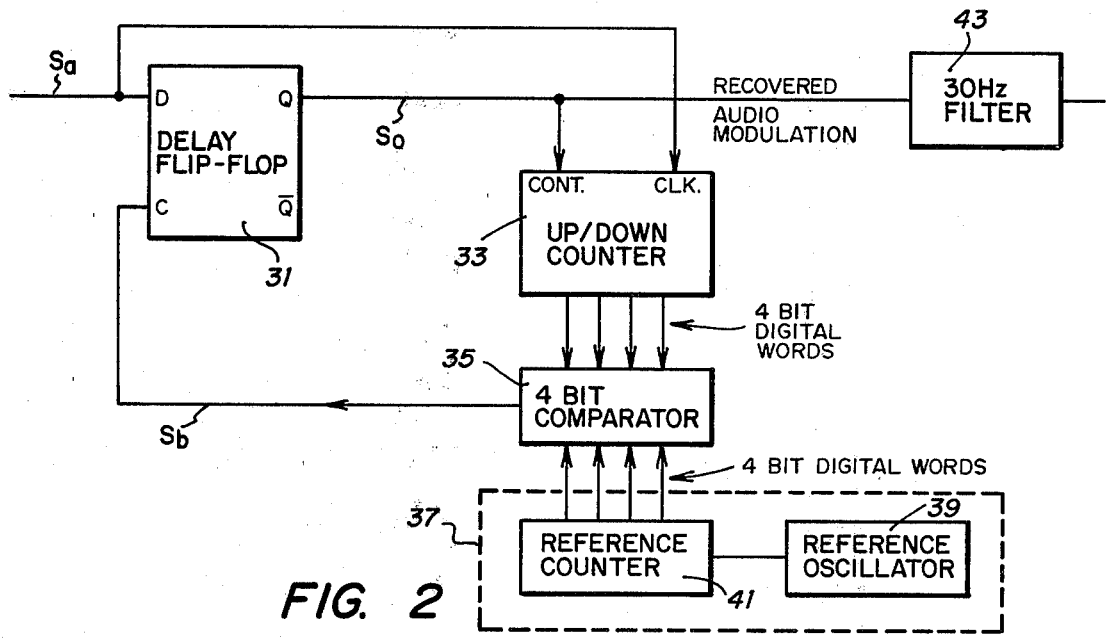
FIG. 2 is a schematic representing and showing the FM demodulator of FIG. 1 in greater detail.

In accordance with the present invention, a digital system suitable for recovering the 30 Hz signal FM'd onto the 9960 Hz carrier is provided and the presently preferred embodiment thereof is illustrated in FIG. 2. With reference now to FIG. 2, a delay (D-type) flipflop 31, which serves as a digital phase detector, is connected for receiving at its D input the 9960 Hz FM signal $S_a$. Preferably, the 9960 Hz signal at input D is a "squared-up" signal such as would be supplied by a limiter. A feedback signal $S_b$ whose generation and development will be described herebelow, is fed into the C input of D flipflop 31. As is known in the art, a D flipflop transfers the clock-pulse-coincident logic state on the D input to the Q output when the clock pulse appears at C.

The flipflop output signal, taken from the Q output, is supplied to the counter-direction-control input of up/down counter 33. A "one" on the up/down control input enables the count up mode, and a "zero" on the up/down control input enables the count down mode. The 9960 Hz FM signal is connected to the clock input of up/down counter 33. Up/down counter 33 counts once per cycle of FM signal input and outputs 16 different four parallel bit digital words, the output word changing to an adjacent word with each count registered. For example, if the output word were word No. 4, the output word would change to either word No. 5 or word No. 3 at the next clock pulse, depending of course on which one of the up or down modes was enabled at the time of the clock pulse.

The four line bus, which carries the four parallel bit counter 33 output words, is input to four bit comparator 35 which also receives as input four parallel bit words from reference word generator 37. Generator 37 comprises a 160 kHz reference oscillator 39 and a four bit reference counter 41, and provides the same 16 digital words, although at a much faster rate, as provided by up/down counter 33. The reference word generator 37 provides, per cycle of the reference oscillator, a successive one of the 16 different digital words.

Comparator 35 provides an output pulse only when the up/down counter word and a reference generator word simultaneously have the same value. The comparator output is used as the loop feedback signal $S_b$ and is connected back to the C input of D flipflop 31. As will become better understood hereinbelow, the D flipflop output signal $S_o$ is a digital signal comprising pulses of fixed width and variable density, said pulse density varying according to the 30 Hz modulation. Thus, in the preferred embodiment, the demodulated audio at the Q output is further processed by a lowpass or bandpass filter 43 in order to provide compatible 30 Hz signals at the FIG. 1 phase detector 25. As will also become clearer hereinbelow, the 30 Hz audio output could also be derived from the up/down counter output because said output is another binary encoded representation of the phase detector output error signal.

Other details of the FIG. 2 apparatus are as follows. D flipflop 31 is a Model 4013 D flipflop. Up/down counter 33 is a Model 4029 up/down counter. Comparator 35 is a Model 4063 comparator. Reference counter 41 is a Model 4020 counter. All these components are available from either RCA or Motorola.

For explaining how the loop locks onto an incoming signal, it is now assumed for simplicity that the input at D, instead of a 9960 Hz FM signal, is a 10 kHz fixed frequency signal and thus that the duration of one up/down counter word is exactly equal to 16 times the duration of one reference generator word. It is now further assumed that the high to low transition of the 10 kHz input signal occurs in the middle of the reference word eleven and further that when the system is first switched on, the first up/down counter word out is word four. Thus, the D input of D flipflop 31 is high at the time comparator 35 outputs a clock pulse to C, and consequently Q is caused to be high, and up/down counter 33 is enabled to count up and supply word five at the low-to-high transition of the 10 kHz signal. At the occurrence of reference word five, the D input has returned to high, and thus Q remains high and causes up/down counter 33 to continue counting up. Such operation continues until up/down counter 33 outputs word 12 which causes comparator 35 to output a pulse just after D has gone low. This causes Q to go low and up/down counter to reverse direction of count. The loop is thus locked and up/down counter 33 alternates its output, at the 10 kHz rate, back and forth between word twelve and word eleven.

Figure 3:
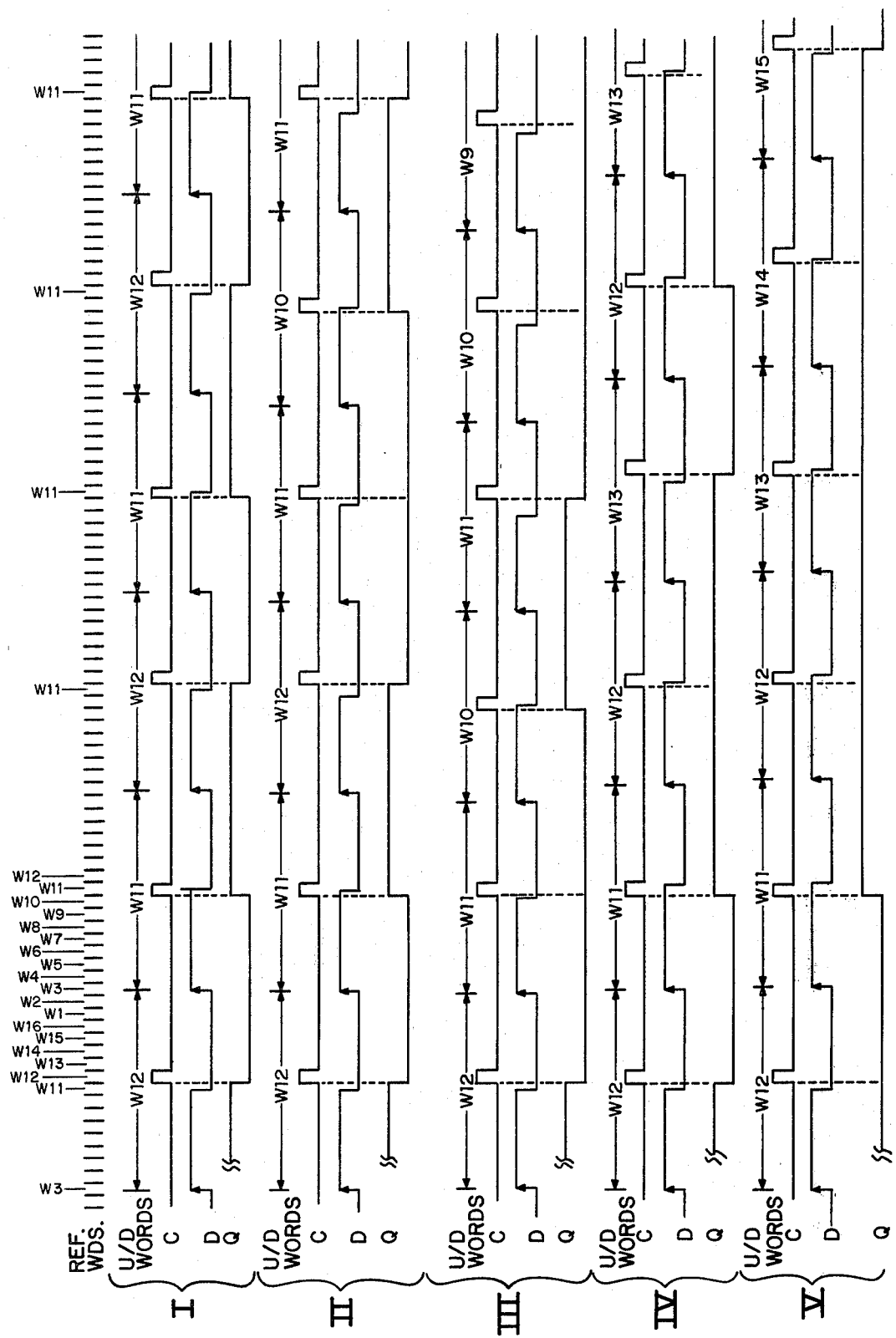
FIGS. 3 and 4 show waveforms useful in explaining the operation of the FIG. 2 apparatus; and, FIG. 5 is a schematic showing an alternative for the FIG. 2 apparatus.

For explaining how the loop operates in a near realistic situation after acquiring lock, reference is now made to FIG. 3 wherein five different examples of loop signals are illustrated, each different example corresponding to a different one of five different fixed frequencies at the D input of flipflop 31. In FIG. 3, the top-most waveform represents the word output of reference generator 37, each of 16 different words W1 through W16 appearing in succession at a 160 kHz rate. This waveform does not vary and thus is shown only once. In examples I through V, the input frequency is assumed to be, respectively, 10 kHz, 10.204 kHz, 10.417 kHz, 9.804 kHz, 9.615 kHz. Each of the five example frequencies, is within the range of 9960 Hz±480 Hz and each was selected to facilitate drawing FIG. 3, as close as practicality allows, to scale.

In each example, the input signal at D is shown; the clock signal at C, provided by comparator 35, is shown; the up/down counter word output is shown, and the delay flipflop output signal from Q is shown.

In example I, the first up/down word illustrated is word W12 and the first state illustrated for Q is high. (Thus the preceding nonillustrated up/down word would be word W11.) At the coincidence of reference generator word W12 and up/down counter word W12, a pulse appears at the C input, and transfers the low input state at D to the Q output, causing Q to go low. With the up/down control input low, the up-down counter changes its output to word W11 at the first-illustrated occurrence of low-to-high transition at D. With up/down counter outputting word W11, the next input pulse at C occurs during word W11 from the reference generator, and at such time, the D output is high and thus Q is forced to go high. The up/down counter thus counts back to output word W12 at the next transition at D from low to high. This process continues such that for the example I frequency, an output signal of approximately 50% duty cycle, or 50% pulse density, is provided at the Q output.

In example II, where the frequency is higher than example I, the same principles of operation apply to produce an output signal at Q whose duty cycle or pulse density is less than that of example I. In example III, which represents an even higher frequency than that of example II, the duty cycle at the Q output has decreased even further.

In examples IV and V, whose frequencies correspond to frequencies increasingly lower than the example I frequency, the output signal duty cycle becomes increasingly greater.

Figure 4:
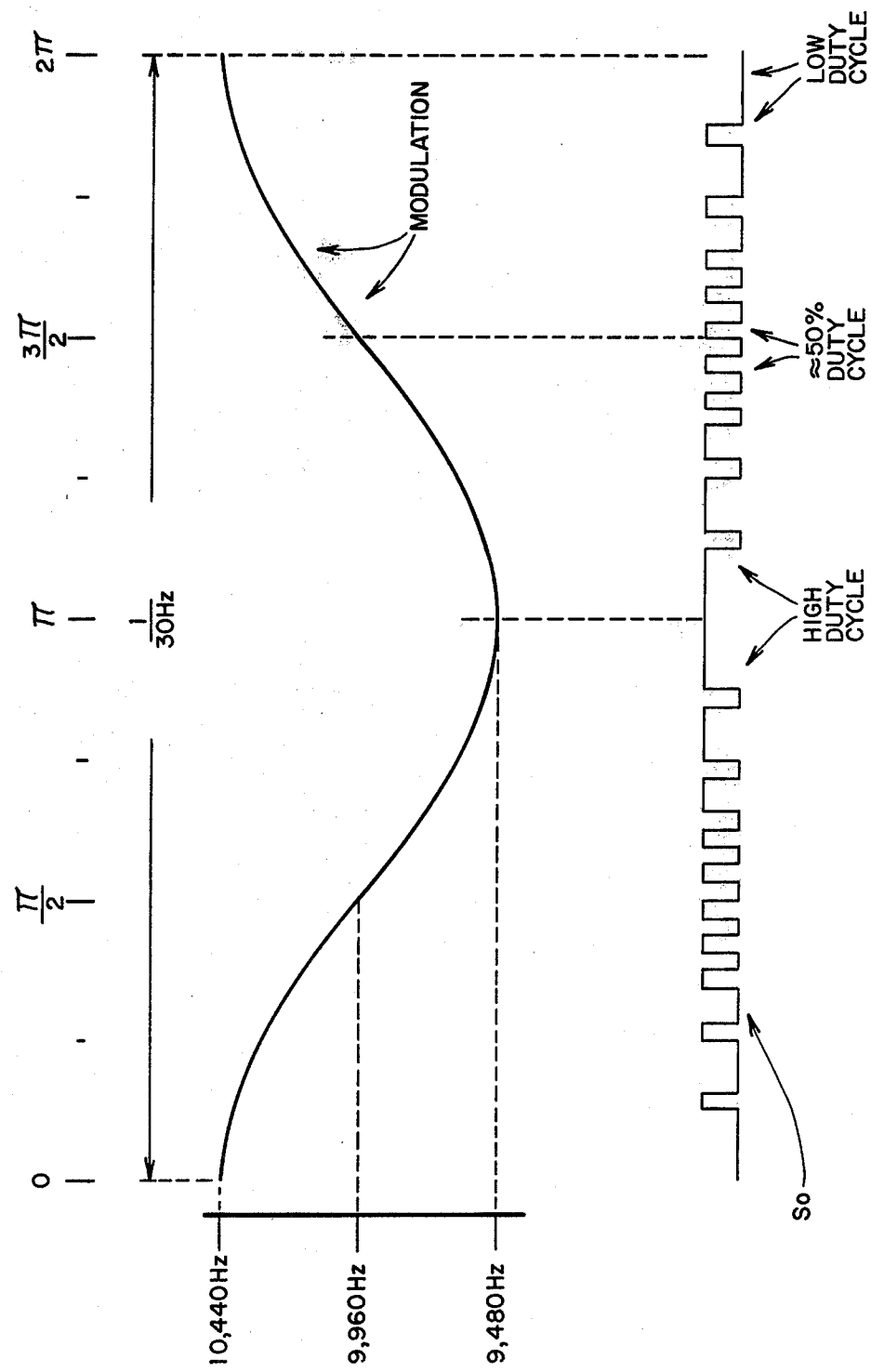

The waveforms in FIG. 4 represent the general nature of the digital output signal $S_o$ assuming the loop is locked onto a 9960 Hz signal which is frequency deviated ±480 Hz according to a 30 Hz sinusoid. The top waveform in FIG. 4 represents a 30 Hz sinusoid whose maximum value represents (9960+480) Hz and whose minimum value represents (9960−480) Hz. Note that for the 9960 Hz input frequency, the output pulse density is near a midpoint density value, or alternately stated, the $S_o$ duty cycle is about 50%. As the frequency deviates toward (9960−480) Hz, the pulse density increases such that the pulses abut one another and form wider pulses whose widths are multiples of the single pulse widths. Thus at the lower input frequencies, the $S_o$ duty cycle becomes quite high. As the frequency deviates toward (9960+480) Hz, the pulse density decreases such that $S_o$ duty cycle is quite low. Thus, at the Q output, pulse density cycles from maximum to minimum to maximum according to the 30 Hz audio modulation on the input signal $S_a$.

It should be emphasized that FIG. 4 is intended primarily to convey a better notion of the form of the output signal, and that to accomplish same, certain liberties have been taken to simplify the illustrated $S_o$ output waveform from Q. For example, the output pulses at Q are presented in FIG. 4 as being about ten times wider than a more accurate and realistic illustration would present them. Also, since the reference generator word rate is 160 kHz, the midpoint or "50%" duty cycle would occur more nearly at (160 kHz/16)=10 kHz instead of at 9.96 kHz. Also, the midpoint duty cycle is not exactly a 50% duty cycle since any one "on" time is seventeen reference generator word lengths, and any one "off" time is fifteen reference generator word lengths.

From the description hereinabove, it may be apparent to those skilled in the art that in some demodulator applications, it may be preferable for the reference word generator to generate words at a rate nearer p times $f_c$ where $f_c$ is the FM signal carrier frequency and p is the value selected for the number of different words produced by the reference generator. More specifically, in the presently employed embodiment $f_c$ is 9960 Hz and p is 16, yet reference generator word rate, which is 160 kHz, is slightly greater than (16)(9960 Hz)=159.36 kHz. Thus in the presently employed embodiment, the midpoint or "50%" duty cycle value more nearly corresponds to (160 kHz/16)=10 kHz than to 9.96 kHz. Alternately stated, if the reference word rate were 159.36 kHz, the plus and minus duty cycle excursions about a midpoint duty cycle value would be more nearly equal in magnitude. Nevertheless, as the demodulator is presently employed, 160 kHz has proven sufficiently close to 159.36 kHz to provide extremely satisfactory results.

It will also be appreciated by those skilled in the art that the demodulator illustrated in FIG. 2 is capable of and suitable for demodulating phase modulated signals.

It will also be apparent to those skilled in the art that numerous and varied modifications in addition to those hereinabove suggested may be made without departing from the inventive principles herein. For example, a frequency divider or multiplier could be inserted between the FM signal and the clock input to up/down counter 33. This could change the number of up/down counts per cycle of FM signal and could effect loop filtering and/or the ability to track. If employed, division or multiplication could be facilitated by using a power of two.

Also, the up/down counter need not be clocked by the FM signal but instead could be provided a clock signal by some other oscillator of appropriate frequency. However it would appear preferable to maintain phase synchronization between the up/down counter words and the FM signal. Of course such synchronization is automatically accomplished by the FIG. 2 apparatus due to the direct connection between D and the up/down counter clock input. Such synchronization is also easily accomplished when inserting a frequency divider or multiplier as mentioned above.

As further examples, the number of different digital words supplied by an up/down counter such as 33 does not have to be 16. Nor does the number of different words supplied by a reference generator such as 37 have to be 16. Nor do the words need to be four bit words. Nor does the number of up/down counter words have to equal the number of reference generator words. Also, a frequency multiplier or divider could be inserted between the comparator output and the delay flipflip C input. Also, the reference word rate need not be sixteen times the up/down counter word rate. It would however appear preferable for the reference word rate to be no less than approximately twice the up/down counter word rate.

Figure 5:
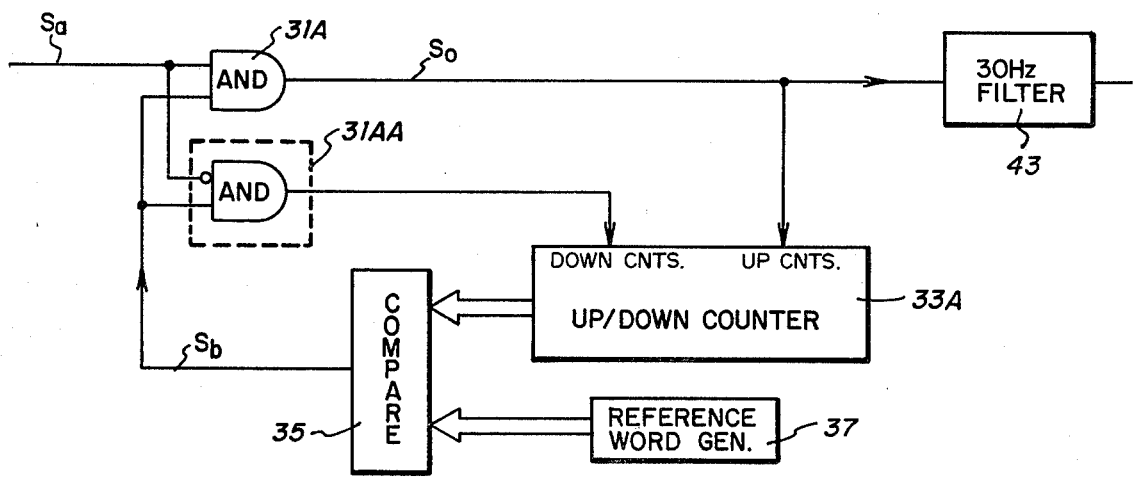

Furthermore, an appropriate phase detector could comprise something other than a delay flipflop. One specific alternative is illustrated in FIG. 5. The demodulator therein illustrated employs AND gate 31A for a phase detector. Other demodulator circuit changes involve using an up/down counter 33A having separate input lines for up-count pulses and down-count pulses. Logic circuit 31AA also comprises an AND gate but additionally has one input preceded by a NOT. AND gate 31A outputs a very short pulse whenever the comparator 35 pulse output coincides with a high state of FM input signal. Logic circuit 31AA outputs a very short pulse whenever the comparator output state coincides with a low state of FM input signal. Up/down counter 33A counts up at the occurrence of an AND gate 31A output pulse and counts down at the occurrence of a logic circuit 31AA output pulse. The AND gate 31A output pulse density is highest at (9960−480) Hz and is lowest at (9960+480) Hz and thus the AND gate 31A output pulse density is seen to vary according to the 30 Hz audio modulation. It should also be noted that the logic circuit 31AA output pulse density also varies according to the 30 Hz audio and thus could be used as the phase detector. However, the logic circuit 31AA output pulse density is lowest at the (9960−480) Hz frequency and is highest at the (9960+480) Hz frequency.

Further exemplary, suitable combinations of the above-described individual modifications will yield additional variations. It will of course be appreciated that these or other modifications may enhance or deteriorate performance depending upon the particular application.

Thus while particular embodiments of the present invention have been shown and/or described, it is apparent that changes and modifications may be made therein without departing from the invention and its broader aspects. The aim of the appended claims, therefore, is to cover all such changes and modifications as fall within the true spirit and scope of the invention.

What is claimed is:

1. A digital phaselock system for demodulating a frequency modulated or phase modulated signal $S_{in}$ comprising:

digital first means, connected for receiving $S_{in}$ and a feedback signal $S_f$, for providing as output a digital signal indicative of phase between $S_{in}$ and $S_f$, second means for providing as output a predetermined number M of different digital words, said words being provided at a rate $R_1$, and said words being provided in a forward or reverse order as a function of phase between $S_{in}$ and $S_f$, third means for providing as output a predetermined number N of different digital words, said words being provided at a rate $R_2$ which is greater than $R_1$, comparison fourth means for receiving the second means words and the third means words and for providing a digital output signal when a predetermined relationship between a second means word and a third means word is incurred, fifth means receiving the fourth means output and providing $S_f$ to said first means, and sixth means for providing recovered modulation information to utilizing apparatus, said sixth means being connected for receiving a predetermined one of (a) the first means output or (b) the second means output.

2. The system as defined in claim 1 wherein said second means comprises a signal source and an up/down counter appropriately connected thereto for registering counts from said signal source.

3. The system as defined in claim 2 wherein said signal source comprises a predetermined one of (i) a source of fixed frequency signal or (ii) a source of variable frequency signal whose instantaneous frequency is proportional to the instantaneous frequency of $S_{in}$.

4. The system as defined in claim 3 wherein the predetermined one of (i) or (ii) is (ii).

5. The system as defined in claim 3 wherein the variable frequency signal instantaneous frequency is approximately equal to $2^k$ times the instantaneous frequency of $S_{in}$, where k is a predetermined one of (a) zero, (b) a positive integer or (c) a negative integer.

6. The system as defined in claim 3 wherein the variable frequency signal and $S_{in}$ are synchronized in phase.

7. The system as defined in claim 3 wherein the source of variable frequency signal comprises means for supplying $S_{in}$.

8. The system as defined in claim 1 wherein M is equal to N.

9. The system as defined in claim 1 where $R_2$ is no less than approximately $2R_1$.

10. The system as defined in claim 1 wherein said fourth means provides its output signal when a second means output word and a third means output word simultaneously have the same value.

11. The system as defined in claim 1 wherein said first means comprises a delay flipflop having D and C inputs connected for receiving, respectively, $S_{in}$ and $S_f$.

12. The system as defined in claim 11 wherein said second means comprises a signal source and an up/down counter appropriately connected thereto for registering counts therefrom, and said up/down counter is connected for being controlled in direction of counting by the delay flipflop output.

13. The system as defined in claim 1 wherein, the frequency of $S_f$ is proportional to the frequency of the fourth means output signal.

14. The system as defined in claim 13 wherein $S_f$ is the fourth means output signal.

15. The system as defined in claim 1 wherein $(R_2/N)$ is approximately equal to the frequency of the $S_{in}$ carrier.

16. The system as defined in claim 15 wherein M is equal to N.

* * * * *